(12) United States Patent
Iwane

(10) Patent No.: US 11,728,816 B2
(45) Date of Patent: Aug. 15, 2023

(54) PLL CIRCUIT, SEMICONDUCTOR APPARATUS, EQUIPMENT

(71) Applicant: CANON KABUSHIKI KAISHA, Tokyo (JP)

(72) Inventor: Masaaki Iwane, Kanagawa (JP)

(73) Assignee: Canon Kabushiki Kaisha, Tokyo (JP)

(*) Notice: Subject to any disclaimer, the term of this patent is extended or adjusted under 35 U.S.C. 154(b) by 0 days.

(21) Appl. No.: 17/692,389

(22) Filed: Mar. 11, 2022

(65) Prior Publication Data
US 2022/0294457 A1  Sep. 15, 2022

(30) Foreign Application Priority Data
Mar. 12, 2021 (JP) .................................. 2021-040668

(51) Int. Cl.
  *H03L 7/089* (2006.01)
  *H03L 7/099* (2006.01)
(52) U.S. Cl.
  CPC ............ *H03L 7/0891* (2013.01); *H03L 7/099* (2013.01)
(58) Field of Classification Search
  CPC ................ H03L 7/0891; H03L 7/099
  See application file for complete search history.

(56) References Cited

U.S. PATENT DOCUMENTS

| | | | | | |
|---|---|---|---|---|---|
| 5,459,437 | A | * | 10/1995 | Campbell | ............ H03K 3/3565 331/25 |
| 11,271,574 | B1 | * | 3/2022 | O'Sullivan | .............. H04B 1/40 |
| 2001/0043123 | A1 | * | 11/2001 | Yabe | ...................... H03K 3/011 331/34 |
| 2004/0251973 | A1 | * | 12/2004 | Ishida | .................. H03K 3/0322 331/16 |
| 2006/0141963 | A1 | * | 6/2006 | Maxim | .................. H03L 7/0891 455/192.1 |
| 2011/0128590 | A1 | * | 6/2011 | Kitai | .................... H04N 1/0083 358/474 |
| 2020/0233331 | A1 | * | 7/2020 | Takao | .................. G03G 15/043 |
| 2022/0294457 | A1 | * | 9/2022 | Iwane | .................. H03L 7/0895 |

FOREIGN PATENT DOCUMENTS

| | | | |
|---|---|---|---|
| JP | 104350 A | | 1/1998 |
| JP | 2003237130 A | * | 8/2003 |
| JP | 2003332907 A | | 11/2003 |
| JP | 2020077960 A | | 5/2020 |

* cited by examiner

*Primary Examiner* — Adam D Houston
(74) *Attorney, Agent, or Firm* — Venable LLP

(57) ABSTRACT

A PLL circuit includes: a charge pump; a voltage-controlled oscillator including an oscillation portion; and a voltage-converting circuit configured to convert a voltage from the charge pump and apply the converted voltage to the voltage-controlled oscillator. The power supply range supplied to the voltage-converting circuit is larger than the power supply range supplied to the oscillation portion of the voltage-controlled oscillator.

15 Claims, 16 Drawing Sheets

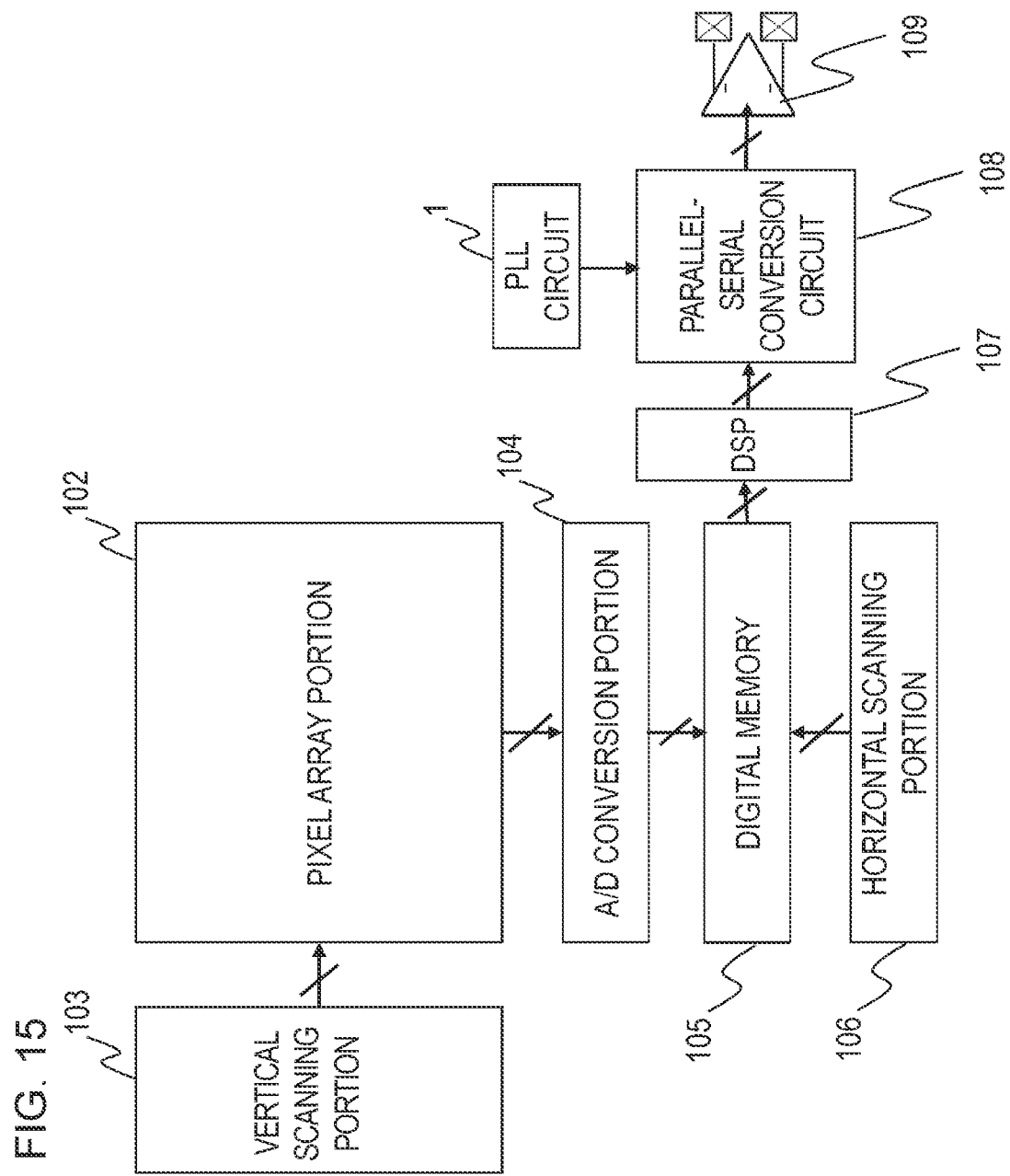

PLL CIRCUIT, SEMICONDUCTOR APPARATUS, EQUIPMENT

BACKGROUND OF THE INVENTION

Field of the Invention

The present invention relates to a PLL circuit, a semiconductor apparatus, and equipment.

Description of the Related Art

Japanese Patent Application Publication No. 2020-77960 describes that the voltage supplied from a power supply circuit to a charge pump is changeable to increase the frequency range (increase the output frequency) of the output signal of a phase locked loop (PLL) circuit.

However, the circuit of the Japanese Patent Application Publication No. 2020-77960 supplies the charge pump with a power supply voltage exceeding the withstand voltage of the charge pump, although for a limited period of time. This may compromise reliability. That is, the life of the MOS transistor of the charge pump may be shortened. Specifically, time-dependent dielectric breakdown (TDDB) tends to occur, which is the breakdown of the oxide film caused by continuously applying a voltage to the oxide film of a semiconductor.

SUMMARY OF THE INVENTION

It is an objective of the present disclosure to increase the frequency of an output signal of a PLL circuit with high reliability.

An aspect of the present technology is a PLL circuit including: a charge pump; a voltage-controlled oscillator including an oscillation portion; and a voltage-converting circuit configured to convert a voltage from the charge pump and apply the converted voltage to the voltage-controlled oscillator, wherein a power supply range supplied to the voltage-converting circuit is larger than a power supply range supplied to the oscillation portion of the voltage-controlled oscillator.

Further features of the present invention will become apparent from the following description of exemplary embodiments with reference to the attached drawings.

BRIEF DESCRIPTION OF THE DRAWINGS

FIG. 15 is a diagram of an imaging device according to a sixth embodiment.

DESCRIPTION OF THE EMBODIMENTS

First Embodiment

Figure 1:
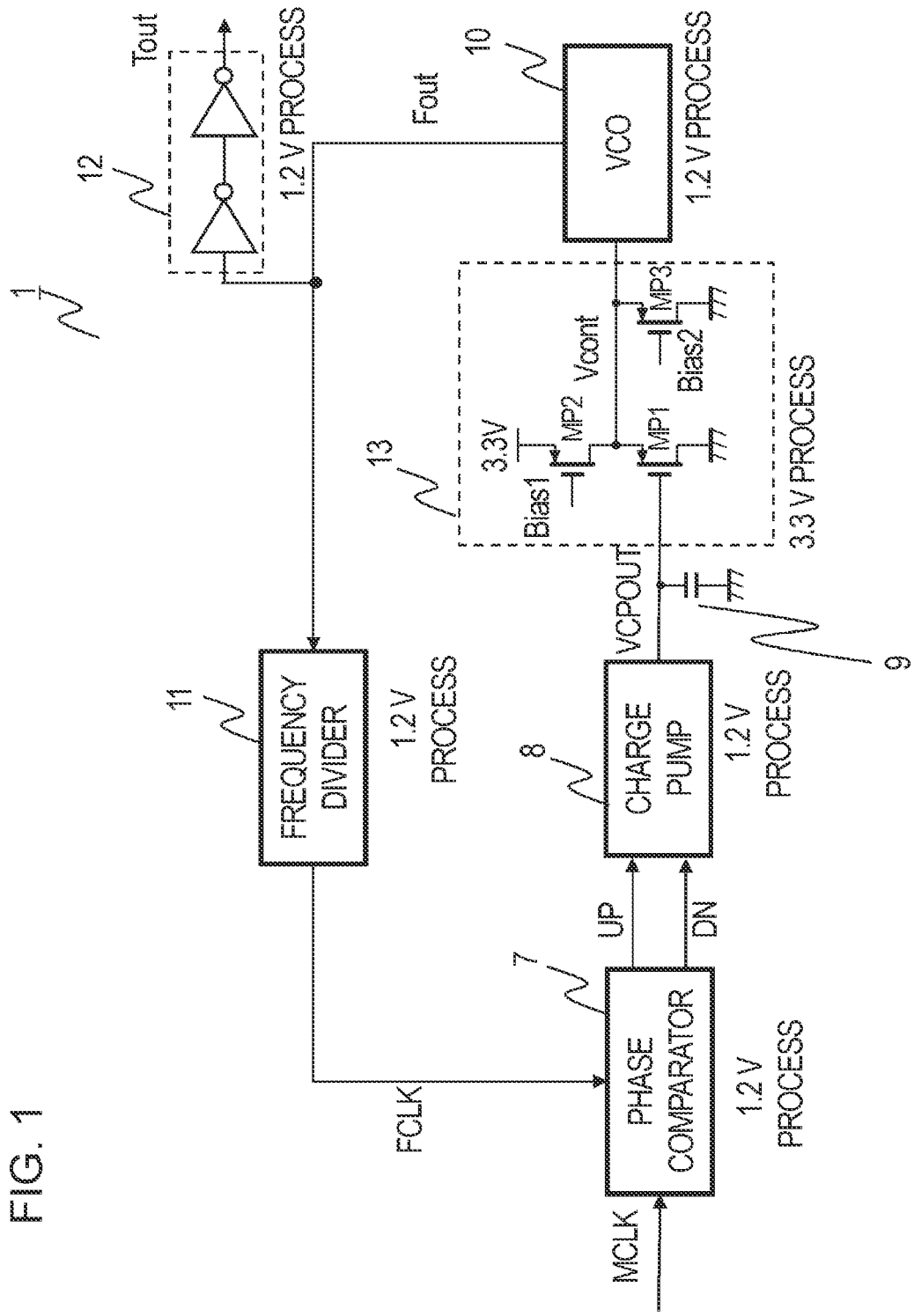
FIG. 1 is a diagram showing a PLL circuit according to a first embodiment.

FIG. 1 is a diagram showing a PLL circuit (phase locked loop circuit) 1 of a first embodiment. The PLL circuit 1 includes a phase comparator 7, a charge pump 8, a capacitor 9, a VCO 10, a frequency divider 11, an output buffer 12, and a voltage-converting circuit 13. The PPL circuit 1 is generally manufactured by a microfabrication process of a withstand voltage of 1.2 V in order to increase the speed. The voltage-converting circuit 13 has a plurality of MOS transistors (transistors MP1 to MP3). At least one of the MOS transistors of the voltage-converting circuit 13 is a high withstand voltage transistor with a withstand voltage of 3.3 V.

Figure 2:
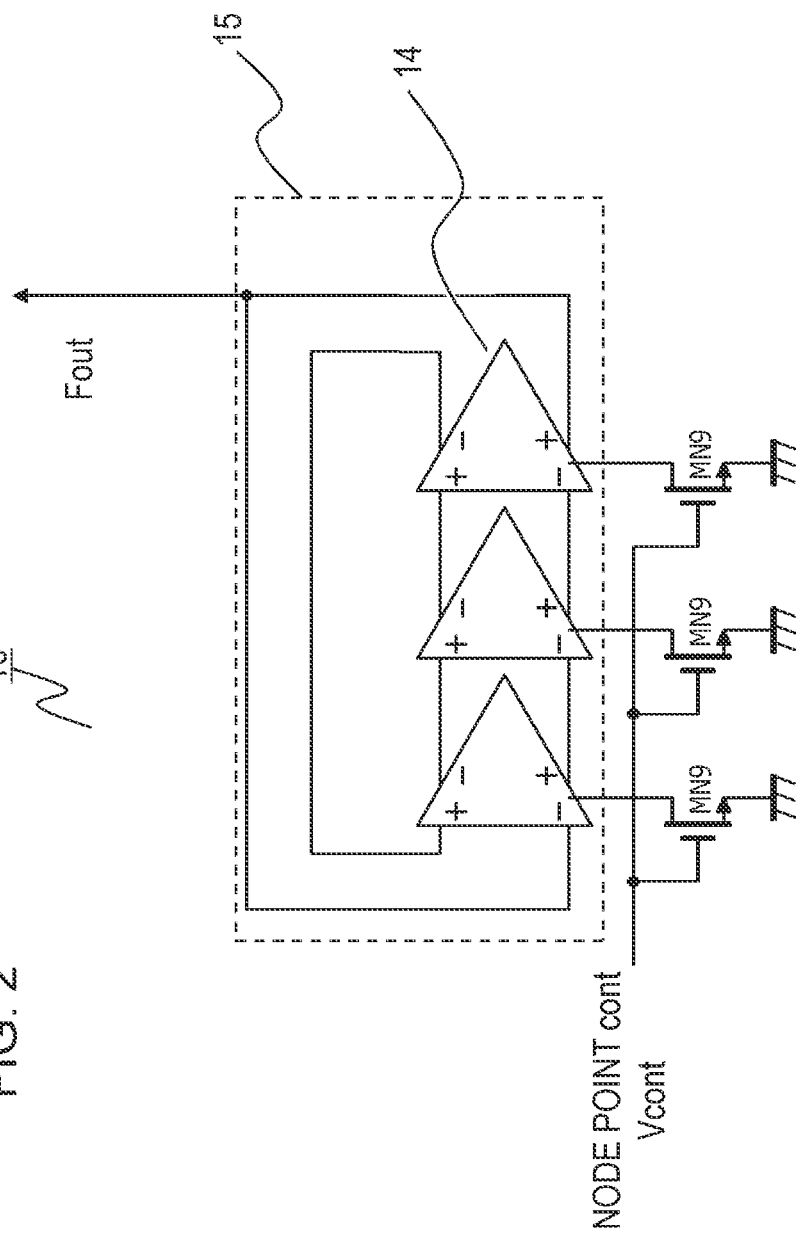
FIG. 2 is an internal circuit diagram of a voltage-controlled oscillator according to the first embodiment.

FIG. 2 is an internal circuit diagram of the voltage-controlled oscillator (VCO) 10. All elements in the VCO 10 are manufactured by a microfabrication process of a withstand voltage of 1.2 V. The VCO 10 has transistors MN9 and an oscillation portion 15. The transistors MN9 are control n-channel MOS transistors for determining the magnitude of the oscillation frequency. The transistors MN9 also limit the amount of current. The oscillation portion 15 includes microfabrication process MOS transistors with a withstand voltage of 1.2 V. The oscillation portion 15 includes fully differential amplifiers 14 including a ring oscillator. The VCO 10 controls the output frequency Fout, which is the frequency of the output signal, according to the voltage Vcont at the voltage control node point cont, which is the applied voltage. In the first embodiment, the positive supply voltage of the VCO 10 (oscillation portion 15) is 1.2 V, and the negative supply voltage of the VCO 10 (oscillation portion 15) is the ground voltage (0 V).

Figure 3:
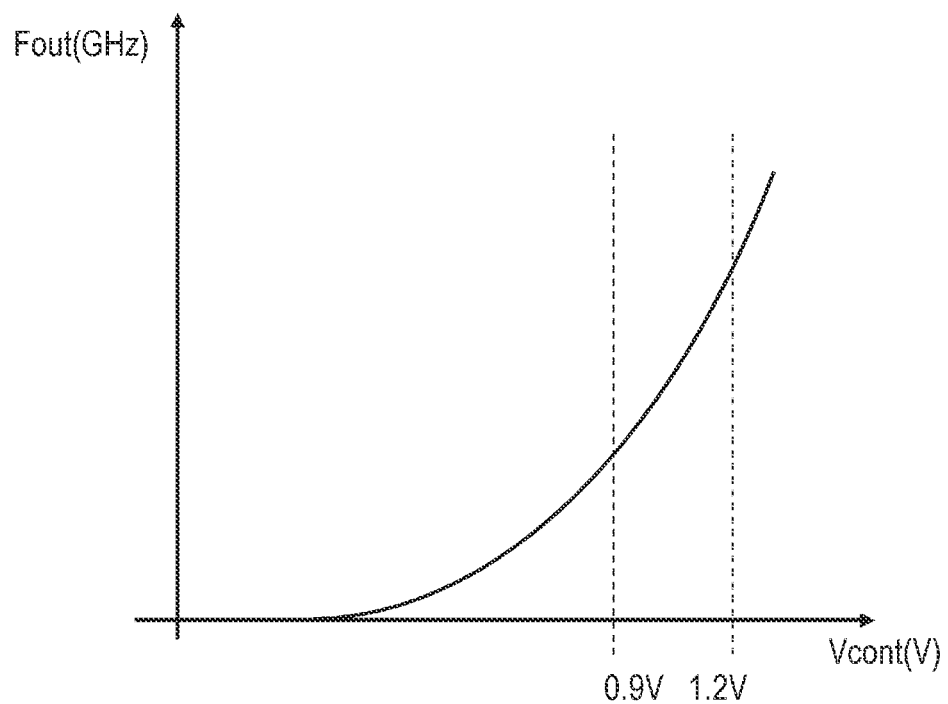
FIG. 3 is a graph showing the output frequency characteristics of the voltage-controlled oscillator according to the first embodiment.

FIG. 3 is a graph showing the output frequency characteristics of the VCO 10. In the graph of FIG. 3, the horizontal axis represents the voltage Vcont of the voltage control node point cont, and the vertical axis represents the output frequency Fout. In the first embodiment, a higher voltage Vcont increases the output frequency Fout.

With a typical charge pump output, the voltage Vcont reaches only up to about 0.9 V. In contrast, the voltage-converting circuit 13 of the present embodiment allows the voltage Vcont to be increased to about 1.2 V. Since the voltage Vcont is not limited to 0.9 V, the VCO 10 can output a high frequency.

Figure 4:
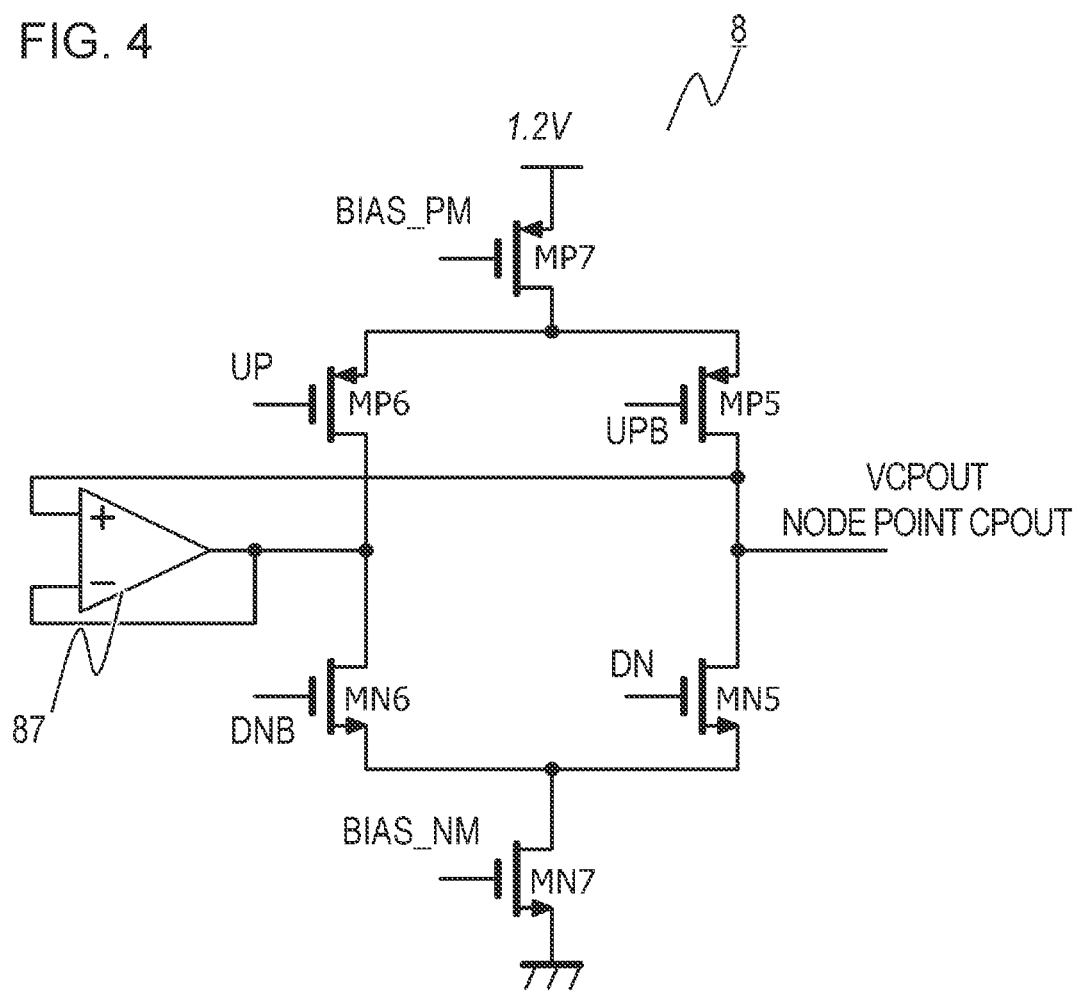
FIG. 4 is a circuit diagram of a charge pump according to the first embodiment.

FIG. 4 is a circuit diagram of the charge pump 8. The charge pump 8 includes transistors MP5, MP6, and MP7 that are p-channel MOS transistors, transistors MN5, MN6, and MN7 that are n-channel MOS transistors, and an operational amplifier 87.

When a bias voltage BIAS_PM is applied to the gate electrode of the transistor MP7, the transistor MP7 serves as the source of source current from the 1.2 V power source. For example, when a bias voltage BIAS_PM of 0.5 V is applied to the transistor MP7, the transistor MP7 serves as the source of source current of 10 μA.

On the other hand, when a bias voltage BIAS_NM is applied to the gate electrode of the transistor MN7, the transistor MN7 serves as the source of sink current to the ground voltage 0 V. For example, when a bias voltage BIAS_PM of 0.7 V is applied to the transistor MN7, the transistor MN7 serves as the source of sink current of 10 μA.

In FIG. 4, signals UP, UPB, DN, and DNB are signals from the phase comparator 7. The signals UPB and DNB are inverted signals of the signals UP and DN, respectively.

The transistor MP5 chances to the on state when the signal UPB to the gate electrode of the transistor MR5 changes to the low state. Then, the transistor MP7 (the source of source current) causes a charging current of 10 μA to flow through the capacitor 9 connected to the current output node point CPOUT via the transistor MP5. The voltage at the current output node point CPOUT is a voltage VCPOUT. The transistor MN5 changes to the on state when the signal DN to the gate electrode of the transistor MN5 changes to the high state. Then, the transistor MN7 (the source of sink current) causes a discharge current of 10 μA to flow through the capacitor 9 connected to the current output node point CPOUT via the transistor MN5.

As shown in FIG. 4, the operational amplifier 87 serves as a voltage follower. The input terminal of the operational amplifier 87 is connected to the current output node point CPOUT. The output terminal of the operational amplifier 87 is connected to the common drain electrode of the transistors MP6 and MN6. This configuration maintains the source-drain voltage of the transistor MP7 and the transistor MN7 greater than or equal to the overdrive voltage (voltage obtained by subtracting the threshold voltage of the transistor from the gate voltage). This allows the transistors MP7 and MN7 to continuously operate as current sources.

As described above, in order for the transistors MP7 and MN7 to operate as current sources, the source-drain voltage needs to be maintained greater than or equal to the overdrive voltage. To this end, the drain voltage of the transistor MP7 needs to be less than or equal to 0.9 V, and the drain voltage of the transistor MN7 needs to be greater than or equal to 0.3 V, for example. The overdrive voltage varies depending on the parameters of the transistors MP7 and MN7 and the bias voltage applied to the gate electrodes.

Furthermore, in the charge pump 8, to ensure that the voltage is greater than or equal to the overdrive voltage at the transistors MP7 and MN7 serving as current sources, the range of the voltage VCPOUT at the current output node point CPOUT is limited to 0.3 V to 0.9 V. For this reason, as shown in FIG. 1, the PLL circuit 1 of the present embodiment connects the voltage-converting circuit 13, which uses high withstand voltage transistors, to the current output node point CPOUT. The output of the voltage-converting circuit 13 is connected to the voltage control node point cont of the VCO 10. The voltage-converting circuit 13 increases the voltage VCPOUT to the voltage VCONT at the voltage control node point cont of the VCO 10.

As shown in FIG. 1, the voltage-converting circuit 13 includes transistors MP1 to MP3, which are p-channel MOS transistors. The voltage-converting circuit 13 is of a source follower amplifier configuration using the transistor MP1 (forming a source follower circuit using the transistor MP1). A voltage Bias1 is applied to the gate electrode of the transistor MP2, and the transistor MP2 thus serves as the current source. The voltage-converting circuit 13 may consist of a plurality of high withstand voltage transistors with a withstand voltage of 3.3 V. In present embodiment, to form the high withstand voltage MOS transistors, each transistor of the voltage-converting circuit 13 has a gate insulating film that is thicker than the gate insulating films of the microfabrication process MOS transistors with a withstand voltage of 1.2 V (the MOS transistors of the oscillation portion 15) of the VCO 10. Furthermore, the voltage-converting circuit 13 uses 3.3 V as the positive supply voltage and the 0 V ground voltage as the negative supply voltage. That is, the power supply range, which is the difference between the positive supply voltage and the negative supply voltage of the voltage-converting circuit 13, is 3.3 V. Accordingly, the power supply range of the voltage-converting circuit 13 is larger than the power supply range of 1.2 V of the VCO 10 (oscillation portion 15). As a result, the voltage-converting circuit 13 can increase the voltage Vcont at the voltage control node point cont applied to the VCO 10 to 1.2 V.

The transistor MP3 is a clipping circuit that performs voltage clipping, which is a process of preventing the voltage Vcont from significantly exceeding 1.2 V (a process of limiting the upper limit of the voltage). A voltage Bias2 used for the voltage clipping is about 0.9 V. The voltage Vcont can also be prevented from exceeding 1.2 V by other techniques, such as lowering the positive supply voltage of the voltage-converting circuit 13 to about 1.8 V, or lowering the voltage Bias1 (bias voltage). As such, the transistor MP3 used for voltage clipping in the voltage-converting circuit 13 is not an indispensable component.

Also, the transistor MP2 may be replaced by a resistor. As such, the transistor MP2 is also not an indispensable component of the voltage-converting circuit 13. In addition to increasing the thickness of the gate insulating film, the withstand voltage of the MOS transistor in the voltage-convening circuit 13 can be increased by using a high withstand voltage gate insulating film or by using an offset MOS transistor.

Additionally, the voltage-converting circuit 13 of the present embodiment is described as forming a source follower using a p-channel MOS, but may form a rail-to-rail operational amplifier.

Figure 5:
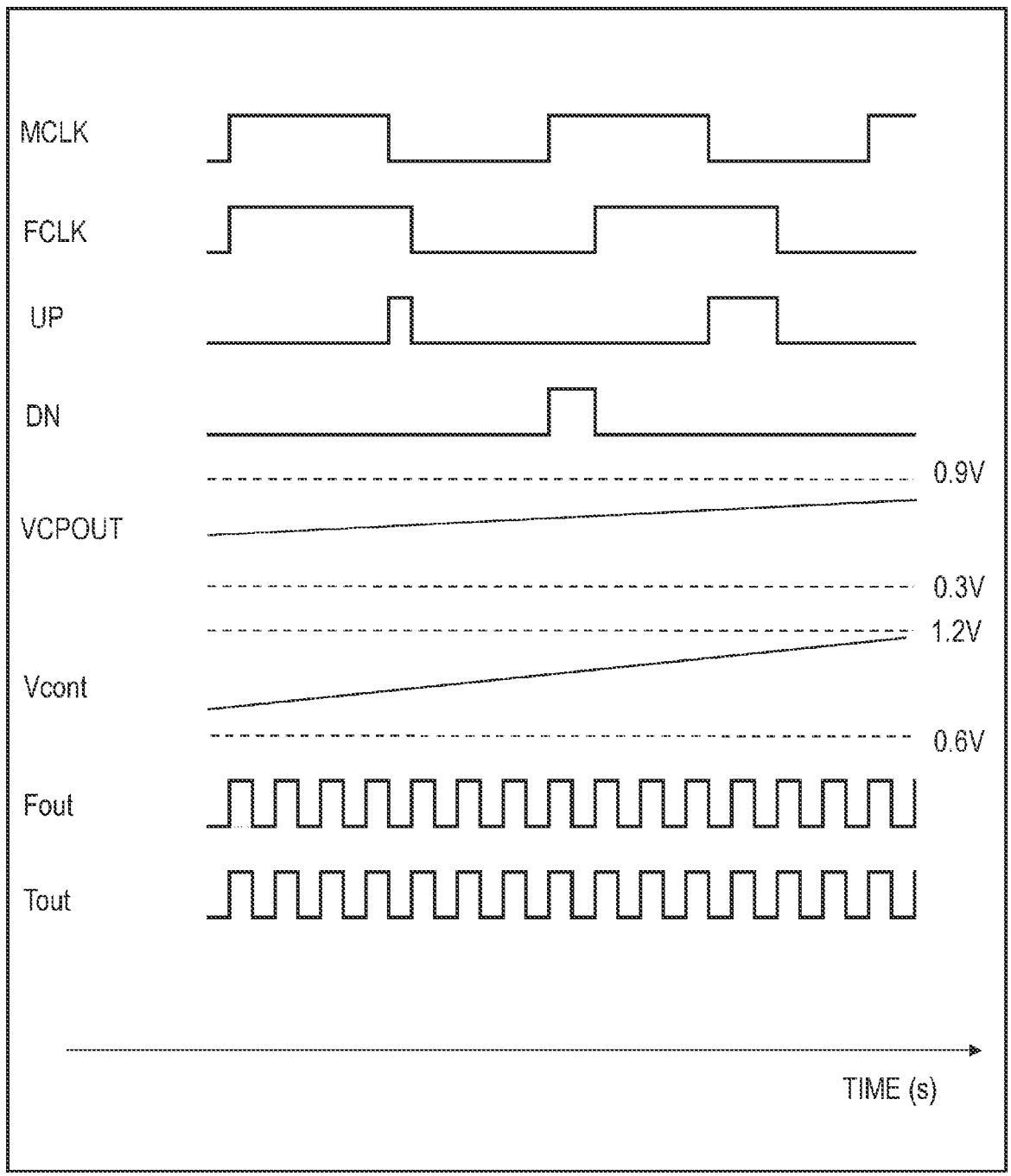
FIG. 5 is a timing chart according to the first embodiment.

FIG. 5 is a timing chart of the signals and clocks of the present embodiment. As shown in FIG. 1, the phase comparator 7 generates pulse output signals UP and DN based on a pulse input master clock MCLK and a feedback clock FCLK. When the master clock MCLK is in the low state and the feedback clock FCLK is in the high state, the signal UP changes to the high state. When the master clock MCLK is in the high state and the feedback clock FCLK is in the low state, the signal DN changes to the high state.

In the timing chart of FIG. 5, the PLL circuit 1 is not locked, and the frequency of the feedback clock FCLK is lower than the frequency of the master clock MCLK. Thus, the period in which the signal UP in the on state is longer than the period in which the signal DN is in the ON state, and the voltage VCPOUT increases with time. Furthermore, in the example of FIG. 5, as the voltage VCPOUT increases, the voltage Vcont also increases to a voltage about 0.5 V higher than the voltage VCPOUT. The voltage-converting circuit 13 thus applies, to the VCO 10, a voltage Vcont higher than the voltage VCPOUT applied from the charge pump 8. The VCO 10 therefore receives a high voltage, allowing the output frequency of the PLL circuit 1 to be higher than in a conventional configuration as described with reference to FIG. 3, This also allows the frequency range of the output signal to be increased. As a result, the processing speed of the PLL circuit 1 is increased while maintaining the reliability of the PLL circuit 1 (charge pump 8).

The high withstand voltage transistor with a withstand voltage of 3.3 V of the voltage-converting circuit 13 according to present embodiment is an example. The advantageous effects of the present embodiment can also be achieved as long as the withstand voltage of the high withstand voltage transistor is higher than the power supply specifications of the other circuits of the PLL circuit 1. The withstand voltage of the high withstand voltage transistor is therefore not limited to 3.3 V.

Second Embodiment

Figure 6:
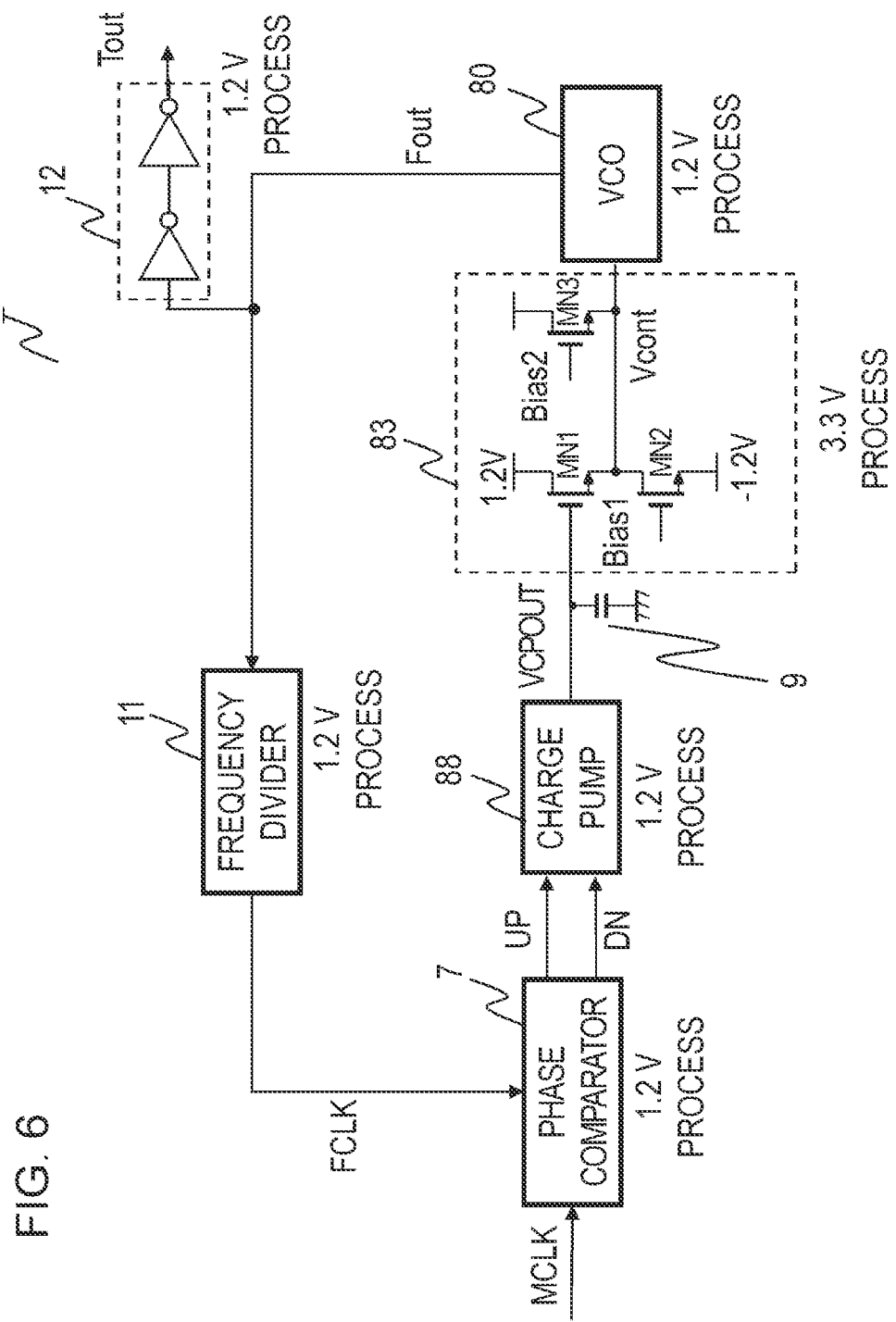
FIG. 6 is a diagram showing a PLL circuit according to a second embodiment.

A PPL circuit 1 of a second embodiment is now described in which the output frequency Fout of a VCO 80 increases as the voltage Vcont at the voltage control node point cont decreases, contrary to the first embodiment. FIG. 6 is a circuit diagram of the PLL circuit 1 according to the second embodiment. The PLL circuit 1 includes a phase comparator 7, a capacitor 9, a frequency divider 11, an output buffer 12, a voltage-converting circuit 83, a charge pump 88, and the voltage-controlled oscillator (VCO) 80. The VCO 80 is manufactured by a microfabrication process of a withstand voltage of 1.2 V. The voltage-converting circuit 83 has a plurality of MOS transistors. At least one of the MOS transistors is a high withstand voltage transistor with a withstand voltage of 3.3 V. In FIG. 6, elements having the same functions as elements shown in FIG. 1 are designated by the same reference numerals as those given in FIG.

Figure 7:
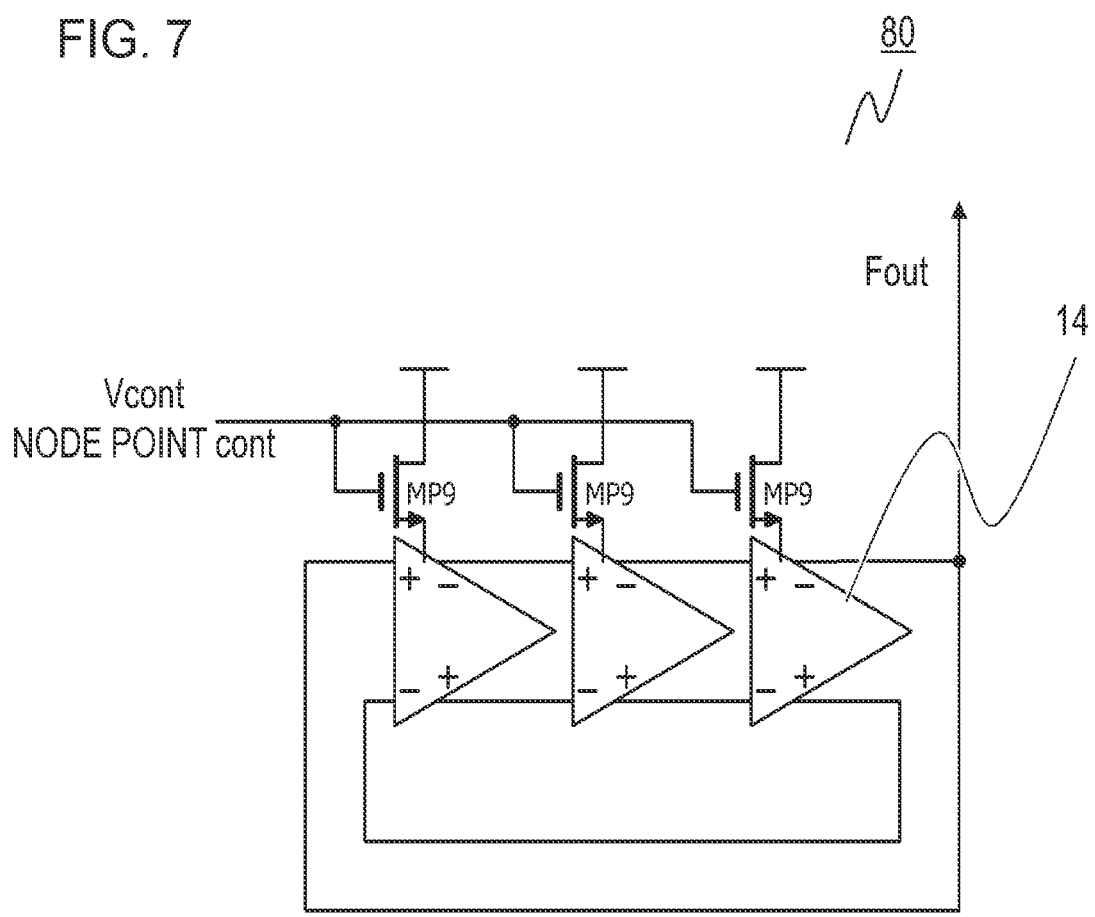
FIG. 7 is an internal circuit diagram of a voltage-controlled oscillator according to the second embodiment.

FIG. 7 is an internal circuit diagram of the VCO 80 of present embodiment. All elements of the VCO 80 are manufactured by a microfabrication process with a withstand voltage of 1.2 V. Transistors MP9 are control p-channel MOS transistors for determining the magnitude of the oscillation frequency. The transistors MP9 also limit the current. Fully differential amplifiers 14 include a ring oscillator. The VCO 80 increases the output frequency Fout as the voltage Vcont at the voltage control node point cont decreases.

Figure 8:
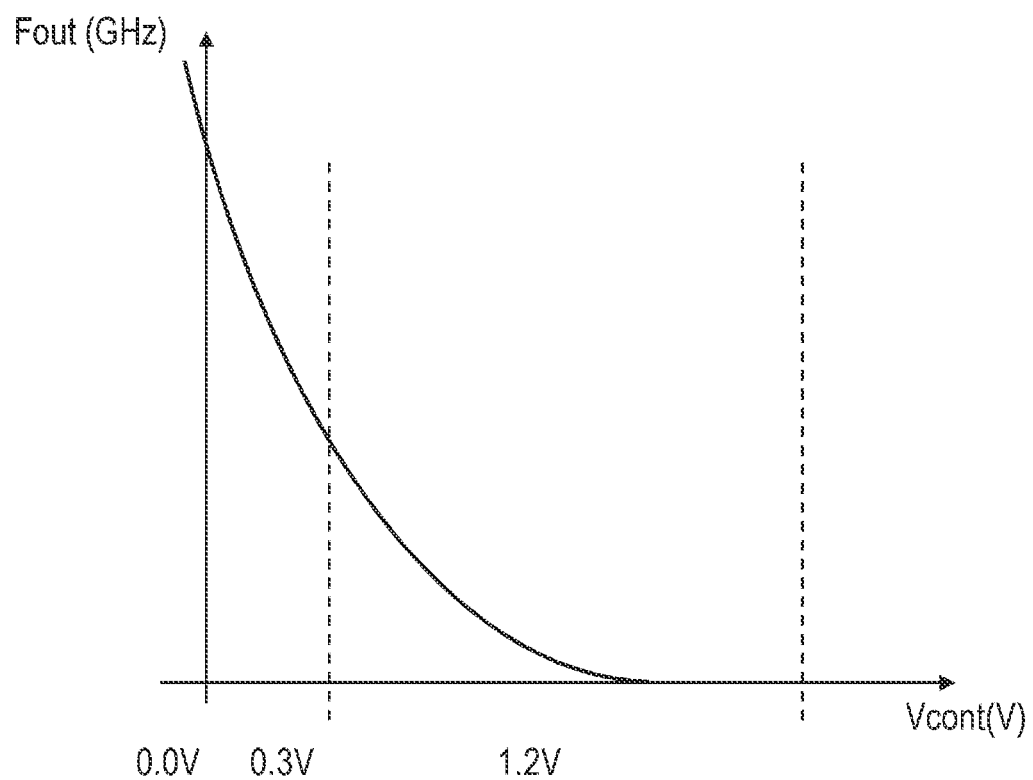
FIG. 8 is a graph showing the output frequency characteristics of the voltage-controlled oscillator according to the second embodiment.

FIG. 8 is a graph showing the output frequency characteristics of the VCO 80 of present embodiment. In the graph, the horizontal axis represents the voltage Vcont, and the vertical axis represents the output frequency Fout.

With a typical charge pump, the input control voltage Vcont can be lowered only to about 0.3 V. However, in the present embodiment, the voltage-converting circuit 83 allows the voltage Vcont to be lowered to about 0.0 V. As a result, the VCO 80 can output a higher frequency than in a configuration in which the limit of the voltage Vcont is 0.3 V.

Figure 9:
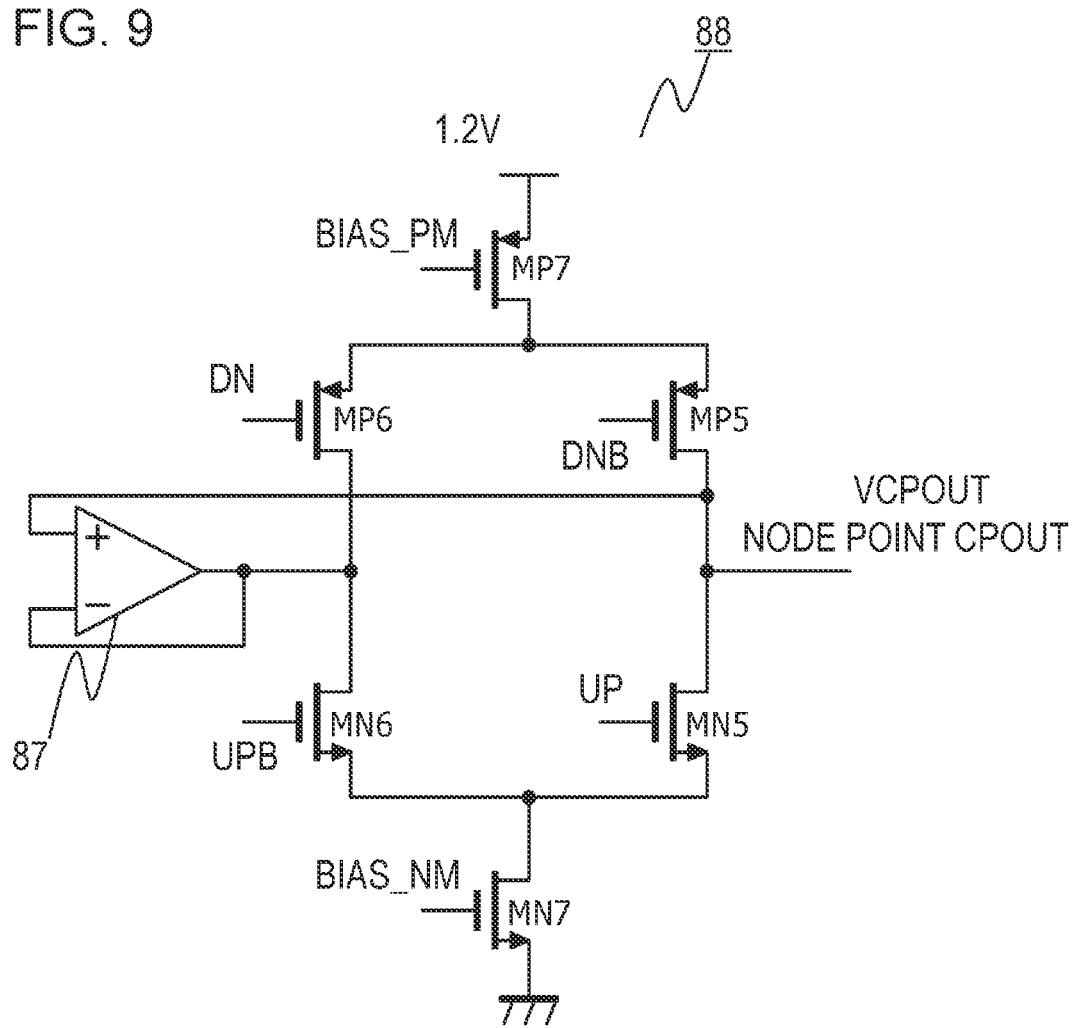
FIG. 9 is a circuit diagram of a charge pump according to the second embodiment.

FIG. 9 is a circuit diagram of the charge pump 88. In present embodiment, the output frequency Font (oscillation frequency) of the VCO 80 increases as the voltage Vcont decreases. As such, with the charge pump 88 of the present embodiment, the signal UP and the signal DN are opposite to those of the charge pump 8 of the first embodiment. This is so configured given the opposite on/off characteristics of the p-channel MOS transistors and the n-channel MOS transistors.

As shown in FIG. 6, the voltage-converting circuit 83 includes transistors MN1 to MN3, which are n-channel MOS transistors. The voltage-converting circuit 83 is of a source follower amplifier configuration using the transistor MN1. A voltage Bias1 is applied to the gate electrode of the transistor MN2, and the transistor MN2 is used as a current source. The voltage-converting circuit 83 includes high withstand voltage transistors. In present embodiment, to form the high withstand voltage MOS transistors, each transistor of the voltage-converting circuit 83 has a gate insulating film that is thicker than the gate insulating film of the microfabrication process MOS transistor with a withstand voltage of 1.2 V of the VCO 80. Furthermore, the voltage-converting circuit 83 uses 1.2 V as the positive supply voltage and −1.2 V as the negative supply voltage. That is, the power supply range, which is the difference between the positive supply voltage and the negative supply voltage supplied to the voltage-converting circuit 83, is 2.4 V. Accordingly, the power supply range of the voltage-converting circuit 83 is larger than 1.2 V of the power supply range of the VCO 80. Thus, the voltage-converting circuit 13 allows the voltage Vcont applied to the VCO 10 to be lowered to 0 V.

The transistor MN3 is a clipping circuit that performs a voltage clipping, which is a process of preventing the voltage Vcont from significantly decreasing below 0 V (a process of limiting the lower limit of the voltage). The voltage Bias2 used for the voltage clipping is about 0.3 V. The voltage Vcont may be prevented from significantly decreasing below 0 V also by lowering the negative supply voltage of the voltage-converting circuit 83 to about −0.3 V or by increasing the voltage Bias1 (bias voltage). As such, the transistor MN3 used for voltage clipping in the voltage-converting circuit 83 is not an indispensable component.

Also, the transistor MN2 may be replaced by a resistor. As such, the transistor MN2 is also not an indispensable component of the voltage-converting circuit 83. In addition to increasing the thickness of the gate insulating film, the withstand voltage of the MOS transistor in the voltage-converting circuit 83 can be increased by using a high withstand voltage gate insulating film or by using an offset MOS transistor.

The voltage-converting circuit 83 of the present embodiment is described as forming a source follower using a p-channel MOS, but may form an operational amplifier.

Figure 10:
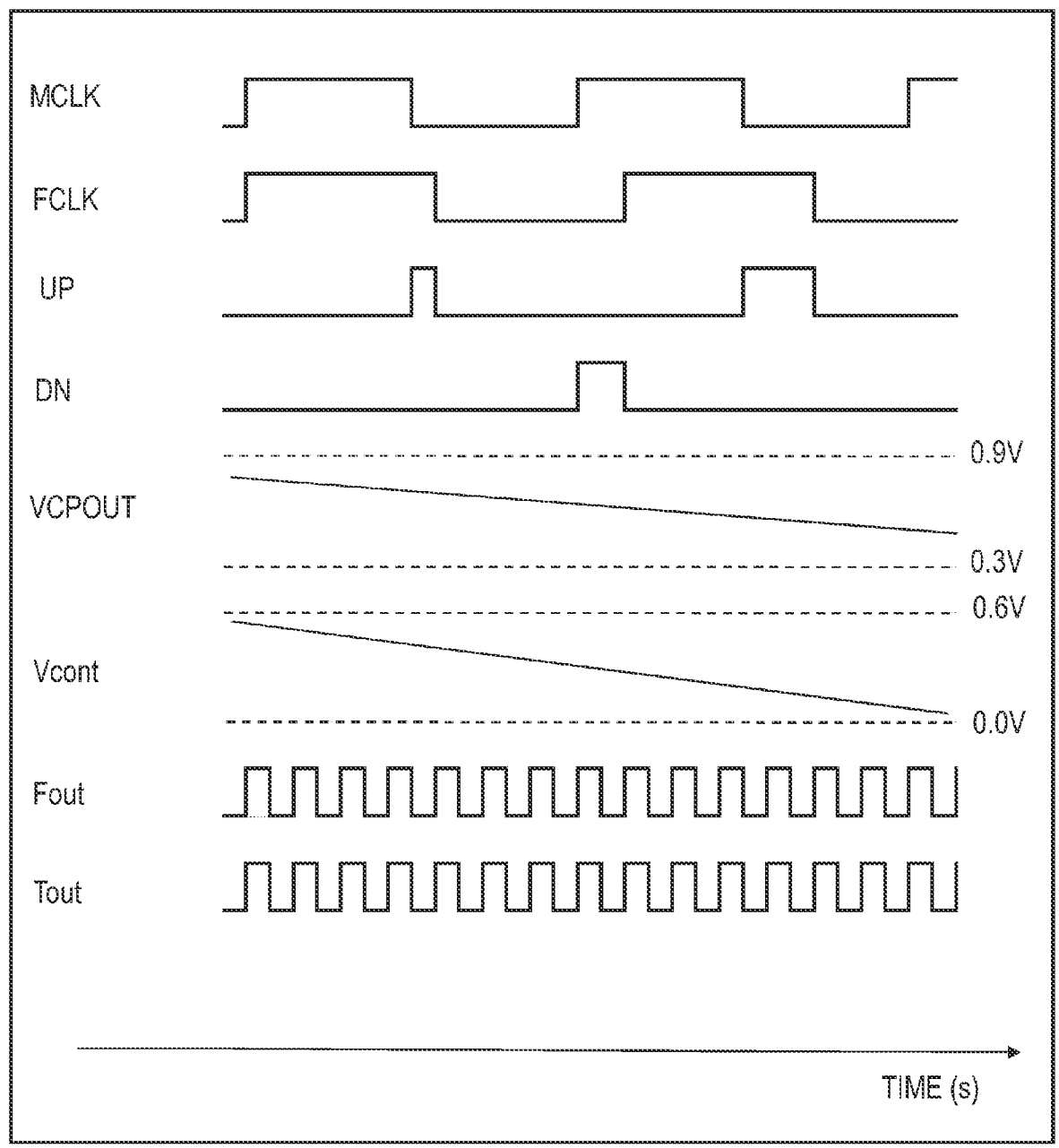
FIG. 10 is a timing chart according to the second embodiment.

FIG. 10 is a timing chart of the voltages, signals, and clocks of the present embodiment. The PPL circuit 1 is not locked, and the frequency of the feedback clock FCLK is lower than the frequency of the master clock MCLK. Thus, the period in which the signal UP in the on state is longer than the period in which the signal DN is in the ON state, and the voltage VCPOUT decreases with time. In the example shown in FIG. 10, as the voltage VCPOUT decreases, the voltage Vcont also decreases to a voltage about 0.5 V lower than the voltage VCPOUT. The voltage-converting circuit 83 thus applies, to the VCO 80, a voltage Vcont lower than the voltage VCPOUT applied from the charge pump 88. The voltage applied to the VCO 80 can therefore be lower than in a conventional configuration, allowing the output frequency of the PPL circuit 1 to be higher than in a conventional configuration.

Third Embodiment

Figure 11:
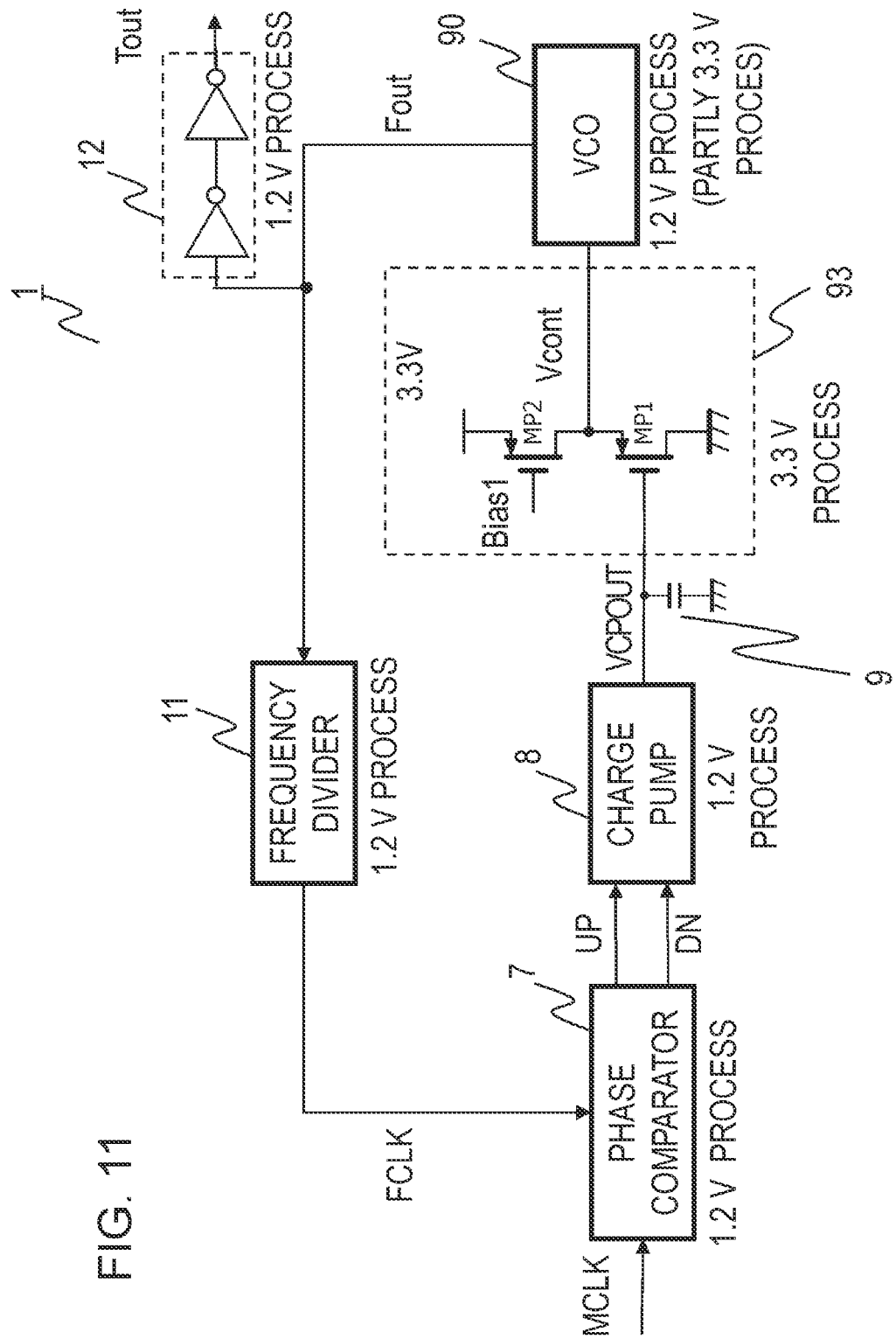
FIG. 11 is a diagram showing a PLL circuit according to a third embodiment.

FIG. 11 is a circuit diagram of a PPL circuit 1 according to a third embodiment. The PLL circuit 1 includes a phase comparator 7, a charge pump 8, a capacitor 9, a frequency divider 11, an output buffer 12, a VCO 90, and a voltage-converting circuit 93. With the VCO 90 (voltage-controlled oscillator), a microfabrication process is used for the MOS transistors of the oscillation portion 15, but the voltage control (current control) MOS transistors are manufactured by a high withstand voltage process. At least one of the MOS transistors forming the voltage-converting circuit 93 is a high withstand voltage transistor having a withstand voltage of 3.3 V. In FIG. 11, elements having the same functions as the elements shown in FIG. 1 are designated by the same reference numerals as those given in FIG. 1.

Figure 12:
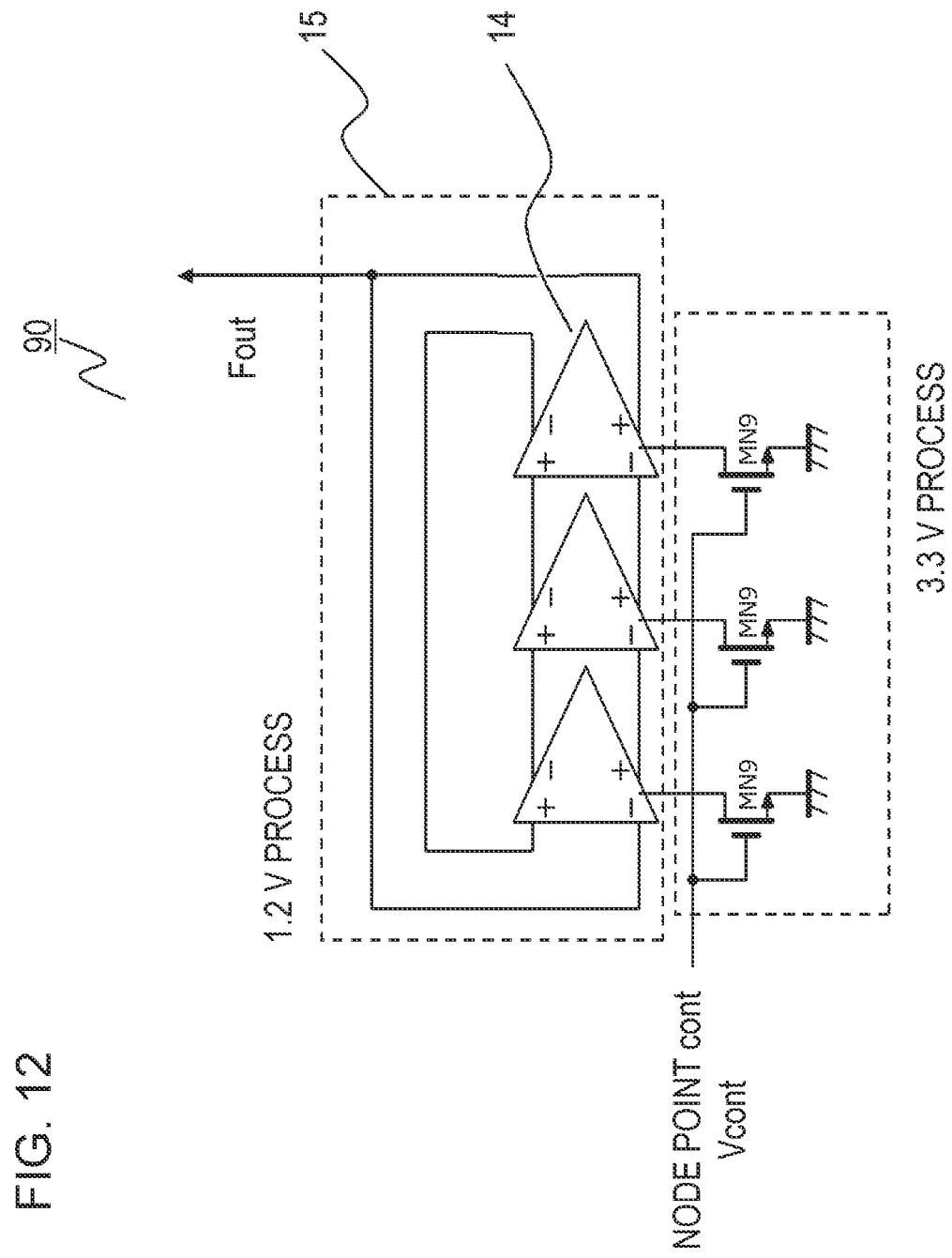
FIG. 12 is an internal circuit diagram of a voltage-controlled oscillator according to the third embodiment.

FIG. 12 is an internal circuit diagram of the VCO 90 according to the present embodiment. The VCO 90 includes transistors MN9 and an oscillation portion 15. The transistors MN9 are n-channel MOS transistors used for controlling the magnitude of the oscillation frequency. In present embodiment, the transistors MN9 are manufactured by a high withstand voltage process of a withstand voltage of 3.3 V. Consequently, a voltage higher than 1.2 V, which cannot be applied when the transistors MN9 are manufactured by a microfabrication process of a withstand voltage of 1.2 V, can be applied to the transistors MN9. The fully differential amplifiers 14 form a ring oscillator. MOS transistors manufactured by a microfabrication process of a withstand voltage of 1.2 V are used for the fully differential amplifiers 14 of the oscillation portion 15. The oscillation portion 15 includes a ring oscillator. As such, the gate insulating film of each transistor MN9, which controls the current and is manufactured by a high withstand voltage process, is thicker than the gate insulating films of the MOS transistors of the oscillation portion 15. In the VCO 90 according to the present embodiment, the output frequency Fout increases as the voltage Vcont increases, as in the graph shown in FIG. 3.

A typical charge pump can output only up to about 0.9 V as a voltage Vcont. In contrast, the voltage-converting circuit 93 of the present embodiment allows the voltage Vcont to be increased to about 1.4 V. The mechanism of the voltage increase in the voltage-converting circuit 93 is similar to that of the first embodiment, but the upper limit of the voltage is not limited to 1.2 V. As a result, the VCO 90 can output a higher frequency than when the voltage Vcont is limited to 0.9 V.

In the present embodiment, the power supply range, which is the difference between the positive supply voltage and the negative supply voltage of the voltage-converting circuit 93, is 3.3 V and is larger than 1.2 V of the oscillation portion 15 of the VCO 90, as in the first embodiment.

As shown in FIG. H the voltage-converting circuit 93 has a single stage source follower (drain ground circuit) configuration to increase the voltage VCPOUT, The voltage-controlled n-channel MOS transistors of the VCO 90 have a withstand voltage of 3.3 V. As such, the voltage-converting circuit 93 may have a two or three stage source follower configuration to increase the voltage Vcont to 3.3 V. Alternatively, a rail-to-rail operational amplifier may be used to increase the voltage.

The high withstand voltage transistor of a withstand voltage of 3.3 V in the present embodiment is merely an example, and the advantageous effects of the present embodiment can be obtained as long as the withstand voltage is higher than the power specifications of the other circuits of the PLL circuit 1. The withstand voltage of the high withstand voltage transistor is therefore not limited to 3.3 V.

Fourth Embodiment

Figure 13:
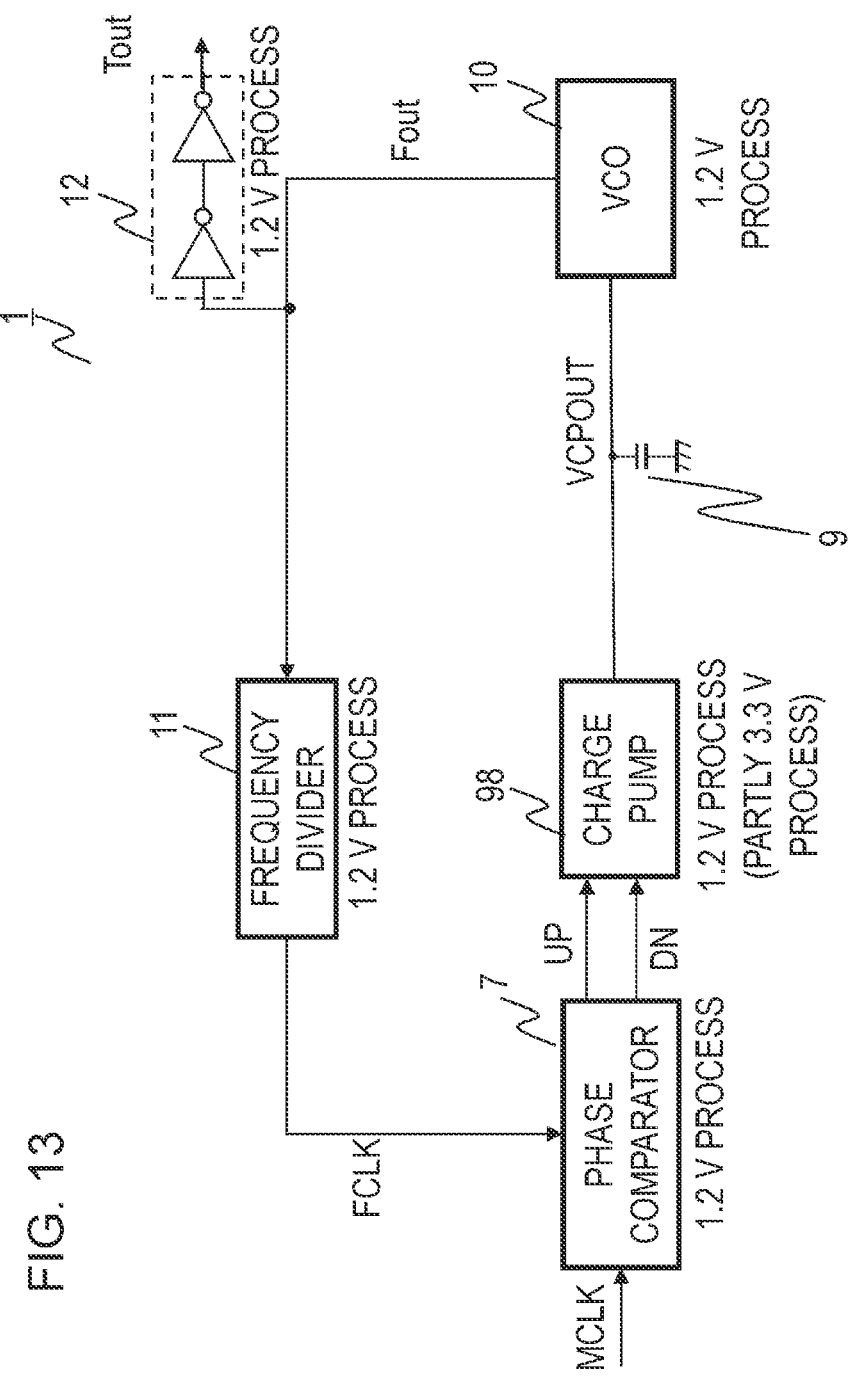
FIG. 13 is a diagram showing a PLL circuit according to a fourth embodiment.

FIG. 13 is a circuit diagram of a PLL circuit 1 according to a fourth embodiment. The PPL circuit 1 according to the fourth embodiment has a phase comparator 7, a capacitor 9, a VCO 10, a frequency divider 11, an output buffer 12, and a charge pump 98. That is, the PLL circuit 1 of present embodiment does not have a voltage-converting circuit. As such, the charge pump 98 applies a voltage VCPOUT to the VCO 10 instead of a voltage-converting circuit. In the charge pump 98, a microfabrication process is used for the MOS transistors that receive signals UP and DN from the phase comparator 7, and a high withstand voltage process is used for the MOS transistors serving as current sources. In FIG. 13, elements having the same functions as elements shown in FIG. 1 are designated by the same reference numerals as those given in FIG. 1.

Figure 14:
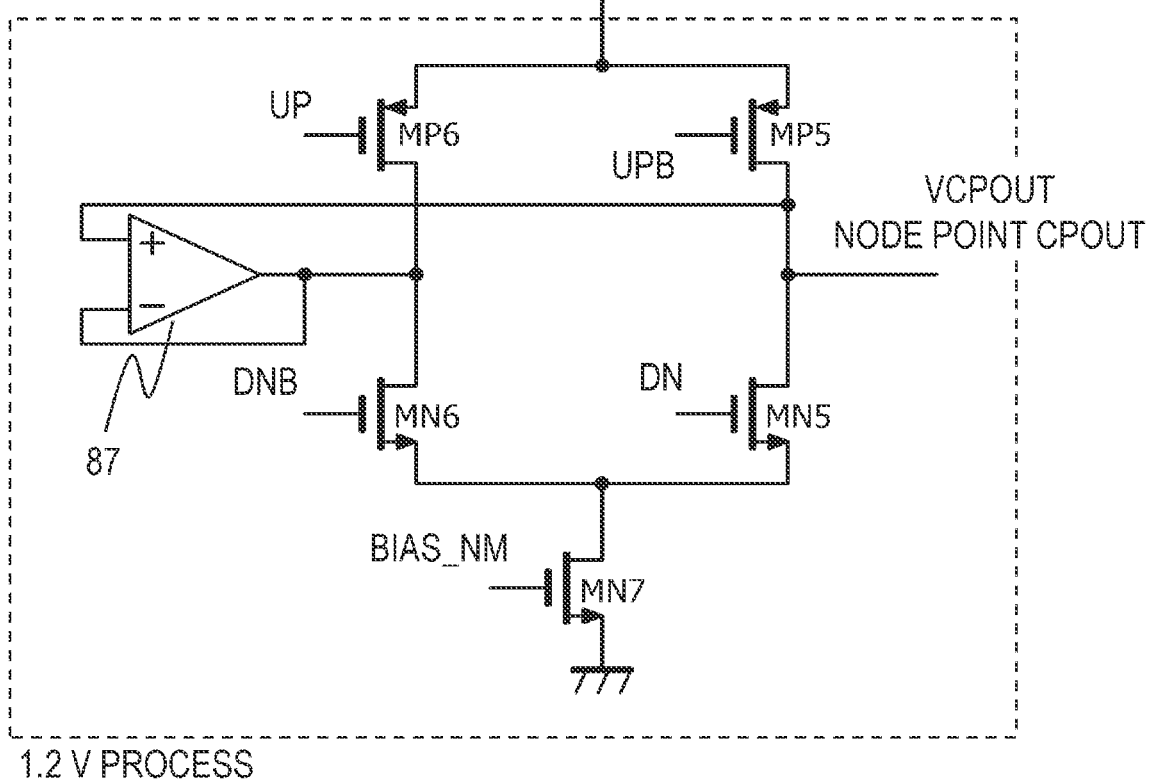
FIG. 14 is a circuit diagram of a charge pump according to the fourth embodiment.

FIG. 14 is a circuit diagram of the charge pump 98. The charge pump 98 includes transistors MP4, MP5, MP6, MP7, MN5, MN6, and MN7 and an operational amplifier 87. The transistor MP7 is a p-channel MOS transistor that serves as the source of source current. The transistor MP4 is a p-channel MOS transistor. The transistor MP4 is a clipping circuit that performs voltage clipping to prevent the drain voltage of the transistor MP7 from increasing above 1.2 V (limit the upper limit of the voltage). The transistors MP4 and MP7 are manufactured by a 3.3 V process of a higher withstand voltage than that of the MOS transistors of the oscillation portion 15 of the VCO 10. The gate insulating films of the transistors MP4 and MP7 are thicker than the gate insulating films of the MOS transistors of the oscillation portion 15 of the VCO 10. The positive supply voltage of the charge pump 98 is 3.3 V. The power supply range supplied to the charge pump 98 is larger than the power supply range supplied to the VCO 10 (voltage-controlled oscillator). The voltage BIAS_PM is 2 V, and the voltage BIAS4 is 0.9 V.

In present embodiment, since the drain voltage of the transistor MP7, which is the source of source current, can be increased to 1.2 V, the upper limit of the voltage VCPOUT output by the charge pump 98 can be increased to 1.2 V. Furthermore, in present embodiment, the MOS transistors that receive pulse output signals DN, DNB, UP, and UPB are manufactured by a 1.2 V process, which is a microfabrication process. Thus, the high speed of the charge pump 98 is maintained.

In present embodiment, the transistor MN7 (n-channel MOS transistor) serving as the source of sink current may also be a high withstand voltage transistor. In this case, the negative supply voltage of the charge pump 98 is preferably about −1.2 V, which is lower than the ground voltage. Since the inside of the VCO 10 is the same as that described in the first embodiment, the gate insulating films of the transistors MN9 are manufactured by a high withstand voltage process and are thus thicker than the gate insulating films of the MOS transistors of the oscillation portion 15.

Fifth Embodiment

A fifth embodiment is an example in which the third and fourth embodiments are combined. A PLL circuit 1 according to the fifth embodiment includes the charge pump 98 according to the fourth embodiment and the VCO 90 according to the third embodiment. This allows the upper limit of the voltage Vcont to be greater than 1.2 V, thereby providing a PLL circuit 1 capable of supporting a higher frequency.

Sixth Embodiment

A sixth embodiment is an example in which a PLL circuit 1 according to the first to fifth embodiments is applied to a semiconductor apparatus. As an example of a semiconductor apparatus, the PLL circuit is applied to an imaging device. Examples of other semiconductor apparatuses include a light-emitting device including a light-emitting element using electroluminescence, and a storage device including a storage element. FIG. 15 is a circuit diagram of an imaging device according to the present embodiment. The imaging device includes a PLL circuit 1, a pixel array portion 102, a vertical scanning portion 103, an A/D conversion portion 104, a digital memory 105, a horizontal scanning portion 106, and a digital signal processor (DSP) 107. The imaging device further includes a parallel-serial conversion circuit 108 and a low voltage differential signaling (LVDS) output circuit 109. The PLL circuit 1 generates a clock signal as a signal-generating circuit. Based on the clock signal, the parallel-serial conversion circuit 108 performs parallel-serial conversion on the image signal obtained by the pixel array portion 102 and transmitted through the A/D conversion portion 104, the digital memory 105, and the DSP 107.

The pixel array portion 102 and the A/D conversion portion 104 may be 3.3 V process MOS transistors having a large withstand voltage. The high withstand voltage process of a withstand voltage of 3.3 V used for the pixel array portion 102 and the A/D conversion portion 104 may also be used for a part of the PLL circuit 1 as in the above embodiments.

In the present embodiment, the components (VCO, charge pump, voltage-controlled oscillator) of the imaging device including the PLL circuit 1 are formed (placed) on the same die (a small piece formed by cutting a wafer into a rectangle of the size required for an integrated circuit or the like) or the same chip. The imaging device is therefore manufactured (formed) by a hybrid process of a microfabrication process and a high withstand voltage process without increasing the manufacturing cost of the PLL circuit 1. This increases the speed of the PLL circuit 1, allowing the parallel-serial conversion circuit 108 and the LVDS output circuit 109 to operate at high speed. As a result, the image data captured by the pixel array portion 102 is output via one output lane from the chip at high speed. The number of output lanes can be reduced accordingly, allowing for a reduced chip area, an increased yield, and a lowered chip cost. Additionally, since the noises of the 3.3 V positive power source and the ground voltage 0 V of present embodiment are small, the PLL circuit 1 and the LVDS output signal have less jitter.

The present embodiment is also applicable to a stacked area sensor that may be formed by bonding the wafer of the pixel array portion 102 and the wafer of other circuits.

According to the above-described embodiments, the PLL circuit 1 supports a higher frequency without compromising the reliability of the PLL circuit 1, increasing the processing speed of the semiconductor integrated circuit. Specifically, the transfer speed of low voltage differential signaling (LVDS) is improved. This allows the number of lanes for LVDS to be reduced, resulting in a smaller chip area due to a reduced number of pins on a chip. Accordingly, the cost per chip is reduced.

The above embodiments may be combined to the extent that does not cause contradiction. For example, the second and fourth embodiments may be combined so that the voltage of the power output by the charge pump can be lowered to 0 V, and the VCO increases the output frequency as the voltage applied from the charge pump decreases. In this case, the charge pump may be configured such that the transistor MN7, which is the source of sink current and has a withstand voltage of 3.3 V, is a high withstand voltage transistor having a withstand voltage of 3.3 V. Furthermore, the charge pump may include a transistor (clipping circuit) that limits an excessive voltage decrease from 0 V (limits the lower limit of the voltage).

Seventh Embodiment

The imaging device as a semiconductor apparatus according to the sixth embodiment is applicable to various types of equipment, as in a seventh embodiment described below. In the seventh embodiment, the semiconductor apparatus according to the sixth embodiment is applied to equipment 9191 as a semiconductor apparatus 930.

Figure 16A:
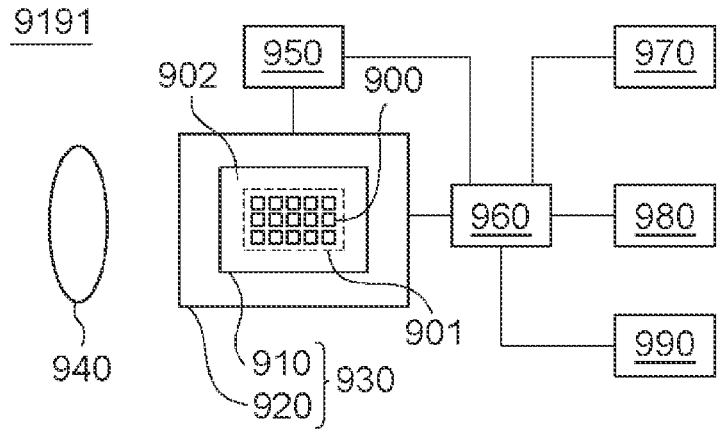
FIG. 16A is a diagram of equipment according to a seventh embodiment.

FIG. 16A is a schematic view illustrating the equipment 9191 including the semiconductor apparatus 930 of the present embodiment. The equipment 9191 including the semiconductor apparatus 930 is now described in detail. The semiconductor apparatus 930 may include a semiconductor device 910, which includes a semiconductor layer, and a package 920, which encloses the semiconductor device 910. The package 920 may include a substrate, on which the semiconductor device 910 is fixed, and a lid, which may be a glass plate facing the semiconductor device 910. The package 920 may further include bonding members, such as bonding wires or bumps that connect terminals provided on the substrate and terminals provided on the semiconductor device 910.

The equipment 9191 may include at least one of an optical device 940, a controller 950, a processor 960, a display device 970, a storage device 980, and a mechanical device 990. The optical device 940 is associated with the semiconductor apparatus 930. The optical device 940 may be a lens, a shutter, or a mirror, for example. The controller 950 controls the semiconductor apparatus 930. The controller 950 may be a semiconductor apparatus such as an ASIC.

The processor 960 processes the signal output from the semiconductor apparatus 930. The processor 960 is a semiconductor apparatus such as a CPU or an ASIC for forming an analog front end (AFE) or a digital front end (DFE). The display device 970 is an EL display device or a liquid crystal display device that displays the information (image) obtained by the semiconductor apparatus 930. The storage device 980 may be a magnetic device or a semiconductor device that stores information (images) obtained by the semiconductor apparatus 930. The storage device 980 may be a volatile memory such as SRAM or DRAM, or a non-volatile memory such as a flash memory or a hard disk drive.

The mechanical device 990 has a moving part or a propulsion part such as a motor or an engine. The equipment 9191 may display the signal output from the semiconductor apparatus 930 on the display device 970 and/or transmit the signal to the outside via a communication device (not shown) included in the equipment 9191. To this end, the equipment 9191 preferably includes the storage device 980 and the processor 960 in addition to the storage circuit and the arithmetic circuit of the semiconductor apparatus 930. The mechanical device 990 may be controlled by the signal output from the semiconductor apparatus 930.

The equipment 9191 is suitable for an electronic device such as an information terminal with an image-capturing function (e.g., a smartphone or a wearable terminal) and a camera (e.g., a camera with interchangeable lens, a compact camera, a video camera, or a surveillance camera). The mechanical device 990 of a camera can drive the components of the optical device 940 for zooming, focusing, and shutter operation. Also, the mechanical device 990 of a camera may move the semiconductor apparatus 930 for vibration isolation operation.

Furthermore, the equipment 9191 may be transportation equipment such as a vehicle, a ship, or a flying object. The mechanical device 990 in transportation equipment can be used as a moving device. The equipment 9191 as transportation equipment is suitable to transport the semiconductor apparatus 930, and to assist and/or automate the driving (maneuvering) using an image-capturing function. The processor 960 for assisting and/or automating driving (maneuvering) may perform a process for operating the mechanical device 990 as a moving device based on the information obtained by the semiconductor apparatus 930, Alternatively, the equipment 9191 may be medical equipment such as an endoscope, measuring equipment such as a distance measuring sensor, analyzing equipment such as an electron microscope, office equipment such as a copying machine, or industrial equipment such as a robot.

The above embodiments can obtain desirable pixel characteristics, achieving an increase in the value of the semiconductor apparatus. An increase in the value used herein refers to at least one of additional function, improved performance, improved characteristics, improved reliability, improved manufacturing yield, reduced environmental load, reduced costs, reduced size, and reduced weight.

The use of the semiconductor apparatus 930 according to present embodiment for the equipment 9191 therefore increases the value of the equipment. For example, the semiconductor apparatus 930 may be installed in transportation equipment to improve the performance in capturing images of the outside of the transportation equipment and in measuring the outside environment. Thus, by determining the semiconductor apparatus according to the present embodiment as a component of transportation equipment when manufacturing or selling the transportation equipment, the overall performance of the transportation equipment is advantageously improved. In particular, the semiconductor apparatus 930 may be suitably used for transportation equipment that assists and/or automates the driving of the transportation equipment using the information obtained by the semiconductor apparatus.

Eighth Embodiment

Figure 16B:
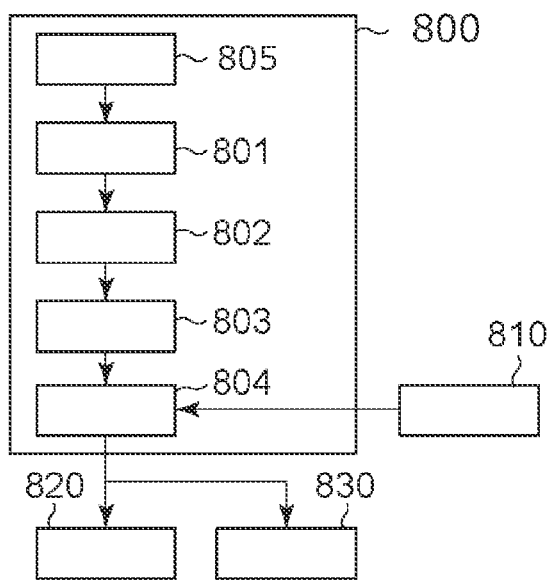
FIG. 16B is a diagram of an imaging system according to an eighth embodiment.
Figure 16C:
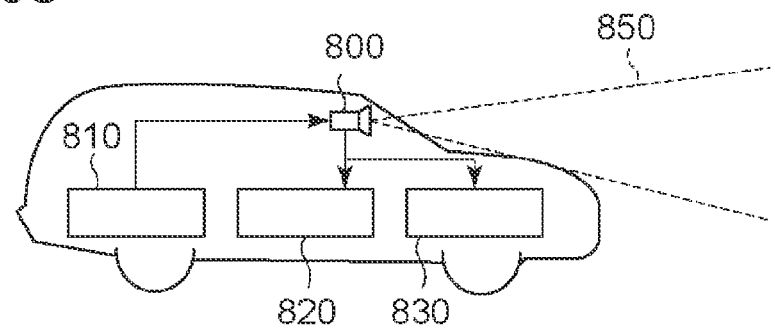
FIG. 16C is a diagram of a moving object according to the eighth embodiment.

Referring to FIGS. 16B and 16C, an imaging system and a moving object of an eighth embodiment are now described. FIGS. 16B and 16C are diagrams showing the configuration of the imaging system and the moving object according to the eighth embodiment.

FIG. 16B shows an example of an imaging system 800 relating to an in-vehicle camera. The imaging system 800 includes a photoelectric conversion device 805. The photoelectric conversion device 805 is a semiconductor apparatus (imaging device) according to the sixth embodiment described above. The imaging system 800 has an image-processing portion 801, which is a processor for performing image processing on a plurality of pieces of image data obtained by the photoelectric conversion device 805. The imaging system 800 includes a disparity-obtaining portion 802, which is a processor that calculates disparity (the phase difference in disparity images) from a plurality of pieces of image data obtained by the photoelectric conversion device 805, The imaging system 800 also includes a distance-obtaining portion 803, which is a processor that calculates the distance to an object based on the calculated disparity, a collision determination portion 804, which is a processor that determines whether there is a possibility of collision based on the calculated distance. The disparity-obtaining portion 802 and the distance-obtaining portion 803 are examples of information-obtaining means for obtaining information such as distance information with respect to an object. That is, the distance information relates to disparity, defocus amount, distance to the object, and the like. The collision determination portion 804 may determine a possibility of collision using any of these distance information pieces. The various processors described above may be implemented by specially designed hardware, or may be implemented by general-purpose hardware that performs operations based on software modules. Furthermore, the processors may be implemented by field programmable gate array (FPGA), an application specific integrated circuit (ASIC), or the like. Alternatively, the processors may be implemented by a combination of the above.

The imaging system 800 is connected to a vehicle information obtaining device 810 to obtain vehicle information such as vehicle speed, yaw rate, and steering angle. The imaging system 800 is also connected to a control ECU 820, which is a controller that outputs a control signal for generating a braking force for the vehicle based on the determination result of the collision determination portion 804. That is, the control ECU 820 is an example of a moving object control means that controls the moving object based on the distance information. The imaging system 800 is also connected to an alarm device 830, which issues an alarm to the driver based on the determination result of the collision determination portion 804. For example, when the determination result of the collision determination portion 804 suggests a high possibility of collision, the control ECU 820 performs vehicle control to avoid the collision and reduce damage by applying the brake, returning the accelerator, or reducing the engine output, for example. The alarm device 830 warns the user by issuing an alarm sound, displaying alarm information on the screen of the car navigation system or the like, or vibrating the seat belt or the steering wheel.

In present embodiment, the imaging system 800 captures images of the surroundings of the vehicle, for example, the front side or the rear side of the vehicle. FIG. 16C shows the imaging system 800 for capturing images of the front side of the vehicle (image range 850). The vehicle information obtaining device 810 sends an instruction to operate the imaging system 800 to capture an image. The use of the semiconductor apparatus (imaging device) according to the sixth embodiment as the photoelectric conversion device 805 allows the imaging system 800 of the present embodiment to further improve the accuracy of distance measurement.

The example described above relates to the control for avoiding collision with other vehicles, but the present disclosure is also applicable to the control for automatic driving following other vehicles, the control for automatic driving that prevents deviation from the lane, and the like. Furthermore, the imaging system is not limited to vehicles such as automobiles, and is applicable to, for example, moving objects (transportation equipment) such as ships, aircraft, and industrial robots. The moving device in the moving object (transportation equipment) may be any of various moving means such as engines, motors, wheels, and propellers. Furthermore, in addition to moving objects, the imaging system is applicable to a wide range of equipment that uses object recognition, including intelligent transportation systems (ITS).

According to the above embodiments, the frequency of the output signal can be increased with high reliability in a PLL circuit.

The embodiments described above can be modified as appropriate without departing from the technical idea. In addition, the disclosure of the present specification encompasses not only the items specified herein but also all items identifiable from the descriptions in this specification and the drawings attached to this specification. The disclosure of this specification also includes a complement of the concepts described herein. That is, when there is a description in the present specification that "A is greater than B", for example, even if the description that "A is not greater than B" is omitted, the present specification is understood to disclose that "A is not greater than B", This is because the description that "A is greater than B" is premised on that "A is not greater than B" is taken into consideration.

Other Embodiments

Embodiment(s) of the present invention can also be realized by a computer of a system or apparatus that reads out and executes computer executable instructions (e.g., one or more programs) recorded on a storage medium (which may also be referred to more fully as 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2021-040668, filed on Mar. 12, 2021, which is hereby incorporated by reference herein in its entirety.

What is claimed is:

1. A PLL circuit comprising:
a charge pump;
a voltage-controlled oscillator including an oscillation portion; and
a voltage-converting circuit configured to convert a voltage from the charge pump and apply the converted voltage to the voltage-controlled oscillator,
wherein a power supply voltage range supplied to the voltage-converting circuit is larger than each of a power supply voltage range supplied to the oscillation portion of the voltage-controlled oscillator and a power supply voltage range supplied to the charge pump.

2. The PLL circuit according to claim 1, wherein
the converted voltage applied to the voltage-controlled oscillator by the voltage-converting circuit is a voltage higher than a voltage output from the charge pump,
wherein the voltage-controlled oscillator is configured to output a signal having a higher frequency because the voltage applied from the voltage-converting circuit is higher than the voltage output from the charge pump.

3. The PLL circuit according to claim 1, wherein
the converted voltage applied to the voltage-controlled oscillator by the voltage-converting circuit is a voltage lower than a voltage output from the charge pump,
wherein the voltage-controlled oscillator is configured to output a signal having a higher frequency because the voltage applied from the voltage-converting circuit is lower than the voltage output from the charge pump.

4. The PLL circuit according to claim 1, wherein
each of the oscillation portion of the voltage-controlled oscillator and the voltage-converting circuit includes a MOS transistor, and
the voltage-converting circuit includes at least one MOS transistor having a gate insulating film that is thicker than a gate insulating film of the MOS transistor of the oscillation portion of the voltage-controlled oscillator.

5. The PLL circuit according to claim 1, wherein
the voltage-controlled oscillator includes an oscillation portion including a MOS transistor, and a MOS transistor configured to limit a current, and
the transistor configured to limit a current has a gate insulating film that is thicker than a gate insulating film of the MOS transistor of the oscillation portion.

6. The PLL circuit according to claim 1, wherein the voltage-converting circuit includes a transistor forming a source follower circuit.

7. The PLL circuit according to claim 1, wherein the voltage-converting circuit and the voltage-controlled oscillator are placed on a same die.

8. The PLL circuit according to claim 1, wherein the voltage-converting circuit includes a clipping circuit configured to limit an upper limit or a lower limit of a voltage.

9. A PLL circuit comprising:
a voltage-controlled oscillator including an oscillation portion having a first MOS transistor; and
a charge pump that is supplied with a first power source and a second power source, and is configured to apply a voltage to the voltage-controlled oscillator, and includes at least one current source and a second MOS transistor, the at least one current source and the second MOS transistor forming a current path between the first power source and the second power source, wherein
a power supply range between the first power source and the second power source supplied to the charge pump is larger than a power supply range supplied to the voltage-controlled oscillator, and
the at least one current source of the charge pump is a high withstand voltage MOS transistor having a higher withstand voltage than each of the first MOS transistor of the oscillation portion and the second MOS transistor.

10. The PLL circuit according to claim 9, wherein the high withstand voltage MOS transistor of the charge pump has a gate insulating film that is thicker than a gate insulating film of the MOS transistor of the oscillation portion of the voltage-controlled oscillator.

11. The PLL circuit according to claim 9, wherein
the voltage-controlled oscillator includes the oscillation portion including a MOS transistor, and a MOS transistor configured to limit a current, and
the transistor configured to limit a current has a gate insulating film that is thicker than a gate insulating film of the MOS transistor of the oscillation portion.

12. The PLL circuit according to claim 9, wherein the charge pump and the voltage-controlled oscillator are placed on a same die.

13. The PLL circuit according to claim 9, wherein the charge pump includes a clipping circuit configured to limit an upper limit or a lower limit of a voltage.

14. A semiconductor apparatus comprising:
the PLL circuit according to claim 1, the PLL circuit being configured to output a clock signal; and
a conversion circuit configured to perform parallel-serial conversion on an image signal based on the clock signal.

15. Equipment comprising:
the semiconductor apparatus according to claim 14; and
one or more of:
an optical device associated with the semiconductor apparatus;
a controller configured to control the semiconductor apparatus;
a processor configured to process a signal output from the semiconductor apparatus;
a display device configured to display information obtained by the semiconductor apparatus;
a storage device configured to store information obtained by the semiconductor apparatus; or
a mechanical device configured to operate based on information obtained by the semiconductor apparatus.

* * * * *